United States Patent
Wang et al.

(10) Patent No.: US 12,532,650 B2
(45) Date of Patent: Jan. 20, 2026

(54) DISPLAY SUBSTRATE, DISPLAY DEVICE, AND DETECTION METHOD FOR CRACK IN ENCAPSULATION STRUCTURE

(71) Applicant: BOE Technology Group Co., Ltd., Beijing (CN)

(72) Inventors: Tao Wang, Beijing (CN); Tao Sun, Beijing (CN); Chengjie Qin, Beijing (CN); Ziyu Zhang, Beijing (CN); Rui Hong, Beijing (CN); Youwei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 846 days.

(21) Appl. No.: 17/788,922

(22) PCT Filed: Sep. 1, 2021

(86) PCT No.: PCT/CN2021/116001
§ 371 (c)(1),
(2) Date: Jun. 24, 2022

(87) PCT Pub. No.: WO2022/088955
PCT Pub. Date: May 5, 2022

(65) Prior Publication Data
US 2023/0046867 A1    Feb. 16, 2023

(30) Foreign Application Priority Data
Oct. 28, 2020   (CN) .......................... 202011175489.8

(51) Int. Cl.
*H10K 59/88*       (2023.01)
*H10K 50/844*      (2023.01)
(Continued)

(52) U.S. Cl.
CPC ........... *H10K 59/88* (2023.02); *H10K 50/844* (2023.02); *H10K 59/122* (2023.02); *H10K 59/131* (2023.02); *H10K 71/70* (2023.02)

(58) Field of Classification Search
CPC .... H10K 59/88; H10K 59/131; H10K 59/122; H10K 71/70; H10K 50/844
See application file for complete search history.

(56) References Cited

U.S. PATENT DOCUMENTS 6,091,131 A * 7/2000 Cook .................. H01L 23/5329
                                                              257/629
10,720,604 B2   7/2020 Kim et al.
(Continued)

FOREIGN PATENT DOCUMENTS

CN      105869551 A    8/2016
CN      108598282 A  * 9/2018 ............. H01L 22/12
(Continued)

OTHER PUBLICATIONS

English translation of CN-108598282-A (Year: 2018).*
(Continued)

*Primary Examiner* — Lex H Malsawma
(74) *Attorney, Agent, or Firm* — WHDA, LLP

(57) ABSTRACT

A display substrate, a display device, and a detection method for crack in encapsulation structure are provided. The display substrate includes: a base substrate including a display region and a peripheral region located on at least one side of the display region; a crack stopper located in the peripheral region and configured to prevent a crack from propagating toward the display region; an encapsulation structure disposed on the base substrate and covering the display region; and a crack detection structure disposed on the base substrate, wherein the crack detection structure is located on a side of the crack stopper facing the display region, an orthographic projection of the crack detection structure on (Continued)

the base substrate falls within an orthographic projection of the encapsulation structure on the base substrate, and the crack detection structure is configured to detect whether a crack exists in the encapsulation structure.

17 Claims, 11 Drawing Sheets

(51) Int. Cl.
*H10K 59/122* (2023.01)
*H10K 59/131* (2023.01)
*H10K 71/70* (2023.01)

(56) References Cited

U.S. PATENT DOCUMENTS

| | | | |
|---|---|---|---|
| 11,138,914 B2 | 10/2021 | Cho | |
| 11,171,305 B2 | 11/2021 | Kim et al. | |
| 11,444,264 B2 | 9/2022 | Kim et al. | |
| 2013/0082843 A1* | 4/2013 | Wurzel | G06F 1/1601 324/525 |
| 2016/0232826 A1 | 8/2016 | Cho | |
| 2016/0293884 A1* | 10/2016 | Zhang | G09G 3/3208 |
| 2016/0322451 A1 | 11/2016 | Park | |
| 2017/0199439 A1* | 7/2017 | Jia | G01R 31/2621 |
| 2017/0256504 A1* | 9/2017 | Minami | H01L 23/5226 |
| 2017/0263880 A1* | 9/2017 | Lee | H10K 59/35 |
| 2018/0158894 A1* | 6/2018 | Park | H10K 50/844 |
| 2018/0174505 A1* | 6/2018 | Mandlik | G09G 3/3677 |
| 2018/0366529 A1* | 12/2018 | Lee | H10K 59/1213 |
| 2019/0157607 A1* | 5/2019 | Kim | H10K 59/122 |
| 2019/0250108 A1 | 8/2019 | Sachs et al. | |
| 2020/0136087 A1 | 4/2020 | Kim et al. | |
| 2020/0212356 A1* | 7/2020 | Kim | H10K 59/122 |
| 2020/0350514 A1 | 11/2020 | Kim et al. | |
| 2020/0410913 A1* | 12/2020 | Wu | G09G 3/006 |
| 2022/0028312 A1 | 1/2022 | Cho | |
| 2022/0037454 A1 | 2/2022 | Kim et al. | |
| 2022/0254285 A1 | 8/2022 | Wang et al. | |

FOREIGN PATENT DOCUMENTS

| | | |
|---|---|---|
| CN | 109830502 A | 5/2019 |
| CN | 111106146 A | 5/2020 |
| CN | 111509026 A | 8/2020 |
| CN | 112289778 A | 1/2021 |

OTHER PUBLICATIONS

International Search Report dated Nov. 25, 2021, issued in counterpart Application No. PCT/CN2021/116001, with English Translation. (12 pages).

Office Action dated Apr. 6, 2022, issued in counterpart CN Application No. 202011175489.8, with English Translation. (29 pages).

* cited by examiner

DISPLAY SUBSTRATE, DISPLAY DEVICE, AND DETECTION METHOD FOR CRACK IN ENCAPSULATION STRUCTURE

CROSS REFERENCE TO RELATED APPLICATION(S)

This application is a Section 371 National Stage Application of International Application No. PCT/CN2021/116001, filed on Sep. 1, 2021, entitled "DISPLAY SUBSTRATE, DISPLAY DEVICE, AND DETECTION METHOD FOR DISPLAY SUBSTRATE", which claims priority to Chinese Patent Application No. 202011175489.8 filed on Oct. 28, 2020, and the contents of which are incorporated herein by reference in their entirety.

TECHNICAL FIELD

The present disclosure relates to a field of display technology, and in particular to a display substrate, a display device, and a detection method for the display substrate.

BACKGROUND

Generally, a display substrate of a display device (e.g., an organic light-emitting diode (OLED) display device) includes an inorganic layer, and it is easy to generate a crack at an edge of the inorganic layer. If the crack at the edge extends into a display region, display defects such as black spots are likely to occur.

The above-mentioned information disclosed in this section is only for understanding the background of the inventive concept of the present disclosure. Therefore, the above-mentioned information may contain information that does not constitute the related art.

SUMMARY

In order to solve at least one aspect of the above-mentioned problem, embodiments of the present disclosure provide a display substrate, a display device, and a detection method for the display substrate.

In an aspect, a display substrate is provided, including:
a base substrate including a display region and a peripheral region located on at least one side of the display region;
a crack stopper located in the peripheral region and configured to prevent a crack from propagating toward the display region;
an encapsulation structure disposed on the base substrate and covering the display region; and
a crack detection structure disposed on the base substrate, wherein the crack detection structure is located on a side of the crack stopper facing the display region, an orthographic projection of the crack detection structure on the base substrate falls within an orthographic projection of the encapsulation structure on the base substrate, and the crack detection structure is configured to detect whether a crack exists in the encapsulation structure.

According to some exemplary embodiments, the crack detection structure is configured such that: in response to a crack existing in the encapsulation structure, a reflectivity of the crack detection structure to light incident thereon decreases; and/or, in response to a crack existing in the encapsulation structure, a resistivity of the crack detection structure increases.

According to some exemplary embodiments, the crack detection structure includes a detection electrode and a detection wire, and the detection electrode and the detection wire are electrically connected to each other; the detection electrode and the detection wire are respectively located in different conductive layers; and an orthographic projection of the detection electrode on the base substrate at least partially overlaps an orthographic projection of the detection wire on the base substrate.

According to some exemplary embodiments, a side portion of the detection electrode facing the crack stopper is overlapped on a side portion of the detection wire facing away from the crack stopper, so as to achieve an electrical connection between the detection electrode and the detection wire.

According to some exemplary embodiments, the display substrate further includes a pixel definition layer, and the pixel definition layer is located between a layer where the detection wire is located and a layer where the detection electrode is located; and the detection electrode is electrically connected to the detection wire through a via hole formed in the pixel definition layer.

According to some exemplary embodiments, the crack detection structure includes a plurality of the detection electrodes, the detection wire includes a plurality of detection wire segments, and orthographic projections of the plurality of detection electrodes on the base substrate and orthographic projections of the plurality of detection wire segments on the base substrate are alternately disposed, and any two adjacent detection electrodes among the plurality of detection electrodes are electrically connected through a detection wire segment; each detection electrode includes a first detection electrode segment and a second detection electrode segment, and the first detection electrode segment and the second detection electrode segment included in the each detection electrode intersect at a connection portion; and an orthographic projection of each of the first detection electrode segment and the second detection electrode segment included in the each detection electrode on the base substrate is disposed obliquely relative to an extension direction of an orthographic projection of a detection wire segment adjacent to the each detection electrode on the base substrate.

According to some exemplary embodiments, the connection portion included in each detection electrode is located on a side of a detection wire segment adjacent to the each detection electrode facing the display region.

According to some exemplary embodiments, the crack detection structure includes a plurality of the detection electrodes, the detection wire includes a plurality of detection wire segments, and the plurality of detection wire segments extend continuously; an orthographic projection of each detection electrode on the base substrate partially overlaps an orthographic projection of at least one of the plurality of detection wire segments on the base substrate; and the orthographic projection of the each detection electrode on the base substrate is disposed obliquely relative to an extension direction of an orthographic projection of a detection wire segment overlapping the each detection electrode on the base substrate.

According to some exemplary embodiments, the display substrate further includes a blocking structure disposed on the base substrate, and the blocking structure is located on a side of the crack stopper facing the display region; the orthographic projection of the crack detection structure on the base substrate is located between an orthographic projection of the crack stopper on the base substrate and an orthographic projection of the blocking structure on the base substrate.

According to some exemplary embodiments, the display substrate further includes a light-emitting device disposed on the base substrate and a driving circuit for driving the light-emitting device; the light-emitting device includes a first electrode disposed on the base substrate, a light-emitting layer disposed on a side of the first electrode away from the base substrate, and a second electrode disposed on a side of the light-emitting layer away from the base substrate; the driving circuit at least includes a power supply signal line for supplying a first power supply voltage, and the power supply signal line is electrically connected to the first electrode; and the detection wire and the power supply signal line are located in a same layer, and the detection electrode and the first electrode are located in a same layer.

According to some exemplary embodiments, the detection wire includes a single-layer structure or a stack, a material of the single-layer structure includes molybdenum, and the stack includes a stack formed of Ti/Al/Ti; and/or a material of the detection electrode includes magnesium, silver or aluminum.

According to some exemplary embodiments, the detection wire has a thickness between 100 angstroms and 200 angstroms; and/or the detection electrode has a thickness between 100 angstroms and 500 angstroms.

According to some exemplary embodiments, the encapsulation structure includes: a first encapsulation layer disposed on a side of a second electrode away from the base substrate, a second encapsulation layer disposed on a side of the first encapsulation layer away from the base substrate, and a third encapsulation layer disposed on a side of the second encapsulation layer away from the base substrate, wherein the first encapsulation layer and the third encapsulation layer include an inorganic material, and the second encapsulation layer includes an organic material; and an orthographic projection of the second encapsulation layer on the base substrate is spaced apart from the orthographic projection of the crack detection structure on the base substrate, and an orthographic projection of each of the first encapsulation layer and the third encapsulation layer on the base substrate covers the orthographic projection of the crack detection structure on the base substrate.

In another aspect, a display device including the above-mentioned display substrate is provided.

In yet another aspect, a detection method for a display substrate is provided, wherein the display substrate includes: a base substrate including a display region and a peripheral region located on at least one side of the display region; a crack stopper located in the peripheral region and configured to prevent a crack from propagating toward the display region; an encapsulation structure disposed on the base substrate and covering the display region; and a crack detection structure disposed on the base substrate; and wherein the detection method includes:

performing a reference detection on a sample of a display substrate and acquiring a reference reflectivity and a reference resistance of a crack detection structure of the sample;

performing an actual detection on an actual product of a display substrate, and acquiring an actual reflectivity and an actual resistance of a crack detection structure of the actual product;

comparing the actual reflectivity to the reference reflectivity, and/or comparing the actual resistance to the reference resistance; and in response to a difference between the reference reflectivity and the actual reflectivity being greater than a preset value, and/or in response to a difference between the actual resistance and the reference resistance being greater than a preset value, determining that a crack exists in an encapsulation structure of the actual product of the display substrate.

BRIEF DESCRIPTION OF THE DRAWINGS

Other objects and advantages of the present disclosure will be clearer through the following description of the present disclosure with reference to the accompanying drawings, which may facilitate a comprehensive understanding of the present disclosure, in the drawings.

Figure 1:
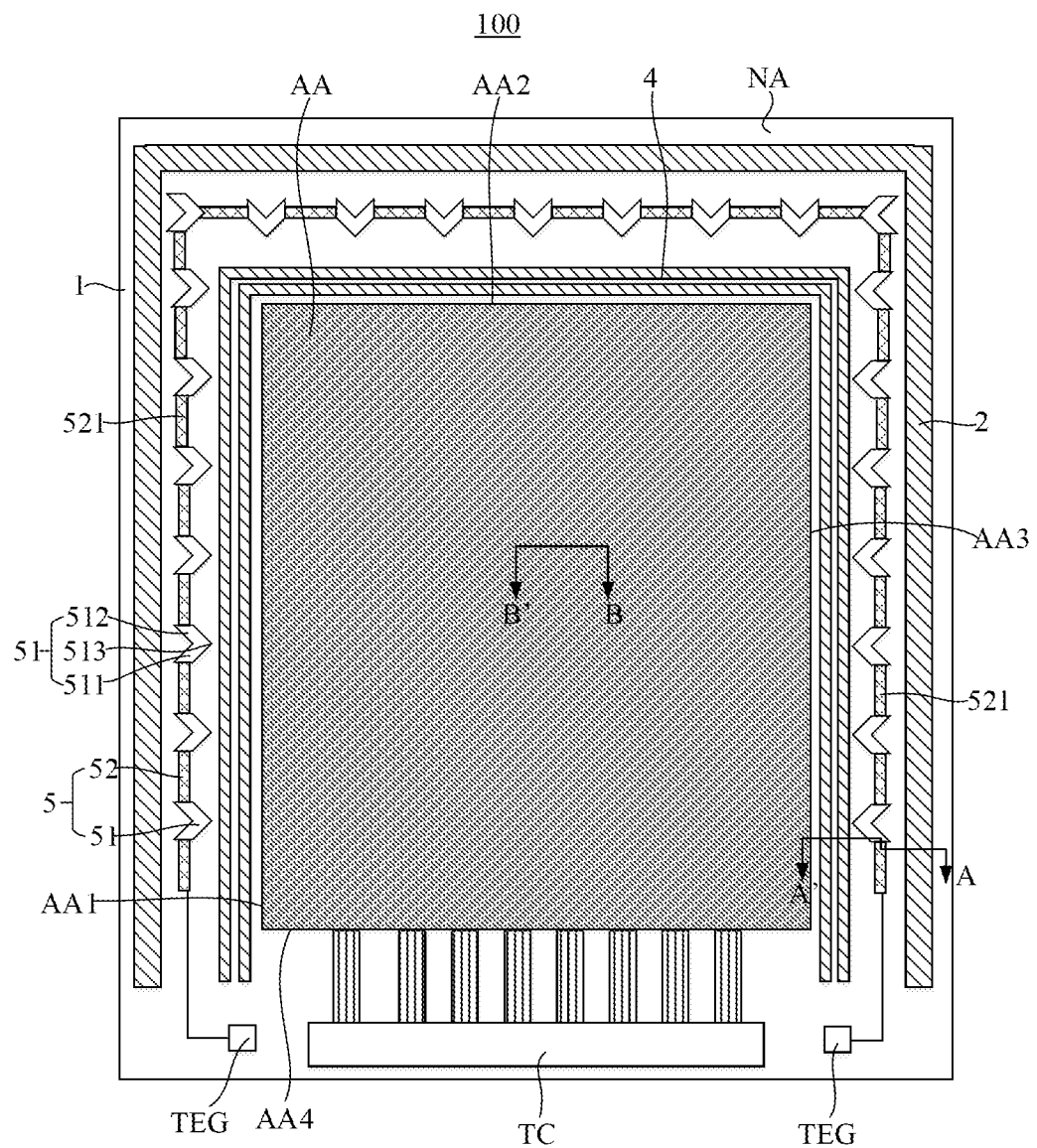
FIG. 1 shows a schematic plan view of a display substrate according to some exemplary embodiments of the present disclosure.

It should be noted that, in the accompanying drawings for describing embodiments of the present disclosure, dimensions of layers, structures or regions may be enlarged or reduced for clarity, i.e., the accompanying drawings are not drawn to actual scale.

DETAILED DESCRIPTION OF EMBODIMENTS

In the following description, for the purpose of explanation, many specific details are set forth to provide a comprehensive understanding of various exemplary embodiments. However, it is obvious that the various exemplary embodiments may be implemented without these specific details or with one or more equivalent arrangements. In other cases, well-known structures and devices are shown in block diagrams in order to avoid unnecessarily obscuring the various exemplary embodiments. In addition, the various exemplary embodiments may be different, but need not to be exclusive. For example, without departing from the inventive concept, specific shape, configuration and characteristics of an exemplary embodiment may be used or implemented in another exemplary embodiment.

In the accompanying drawings, for clarity and/or description purposes, size and relative size of elements may be enlarged. Accordingly, the size and relative size of each element need not to be limited to those shown in the drawings. When the exemplary embodiments may be implemented differently, the specific process sequence may be different from the sequence described. For example, two consecutively described processes may be performed substantially simultaneously or in a reverse order. In addition, same reference signs represent same elements.

When an element is described as being "on", "connected to" or "coupled to" another element, the element may be directly on the another element, directly connected to the another element, or directly coupled to the another element, or an intermediate element may be present. However, when an element is described as being "directly on", "directly connected to" or "directly coupled to" another element, no intermediate element is provided. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y or Z" and "at least one selected from a group consisting of X, Y and Z" may be interpreted as only X, only Y, only Z, or any combination of two or more of X, Y and Z, such as XYZ, XY, YZ and XZ. As used herein, the term "and/or" includes any and all combinations of one or more of the listed related items.

It may be understood that, although the terms "first," "second," etc. may be used herein to describe different elements, the elements should not be limited by the terms. The terms are only used to distinguish one element from another. For example, without departing from the scope of example embodiments, a first element may be termed a second element, and, similarly, a second element may be termed a first element.

For the purpose of description, spatially relative terms such as "below", "under", "beneath", "down", "over", "on", "above", "higher" or "side" (e.g., in a "sidewall"), etc., may be used in the present disclosure to describe a relationship between one element and another element (or other elements) as shown in the figures. In addition to orientations depicted in the figures, the spatially relative terms are intended to contain different orientations of the device in use, operation, and/or manufacture. For example, if a device in the figures is turned over, an element described as "below" or "under" another element or feature would then be oriented "above" the other element or feature. Thus, the exemplary term "under" may contain both upper and lower orientations. In addition, the device may be otherwise oriented (e.g., rotated 90 degrees or at other orientations). Therefore, the spatially relative terms used in the present disclosure may be interpreted accordingly.

Unless otherwise defined, all terms (including technical and scientific terms) used in the present disclosure have the same meaning as commonly understood by those skilled in the field to which present disclosure belongs.

The embodiments of the present disclosure provide a display substrate, a display device, and a detection method for the display substrate. The display substrate includes: a base substrate including a display region and a peripheral region located on at least one side of the display region; a crack stopper located in the peripheral region and used to prevent a crack from propagating toward the display region; an encapsulation structure disposed on the base substrate and covering the display region; and a crack detection structure disposed on the base substrate, wherein the crack detection structure is located on a side of the crack stopper facing the display region, an orthographic projection of the crack detection structure on the base substrate falls within an orthographic projection of the encapsulation structure on the base substrate, and the crack detection structure is used to detect whether a crack exists in the encapsulation structure. In the display substrate provided by the embodiments of the present disclosure, a reliability of the encapsulation structure may be accurately determined.

Figure 2:
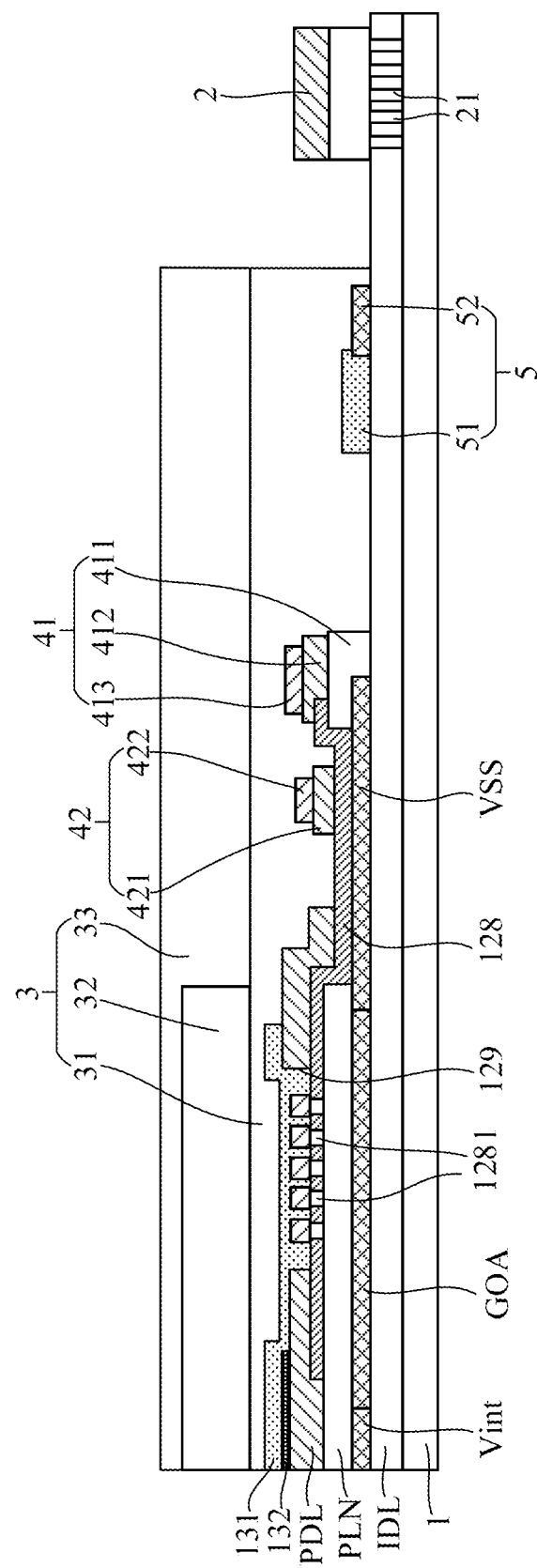
FIG. 2 shows a schematic cross-sectional view of a display substrate taken along a line AA' in FIG. 1 according to some exemplary embodiments of the present disclosure.
Figure 3:
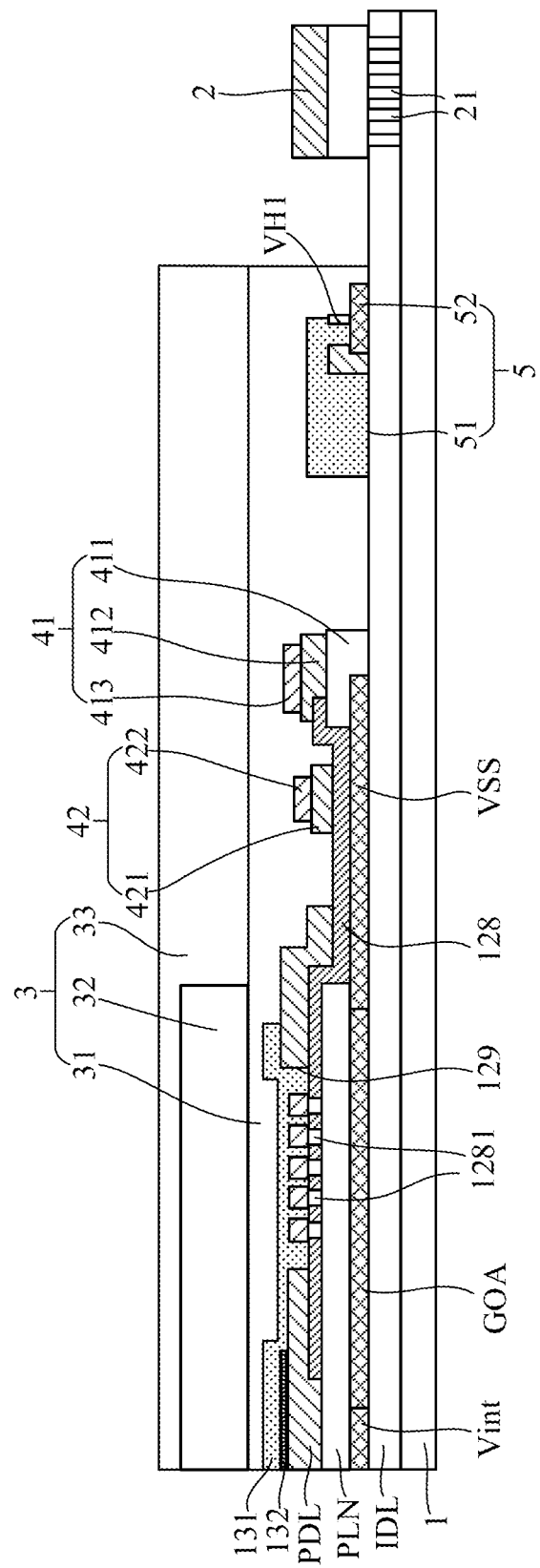
FIG. 3 shows a schematic cross-sectional view of a display substrate taken along a line AA' in FIG. 1 according to other exemplary embodiments of the present disclosure.

FIG. 1 shows a schematic plan view of a display substrate according to some exemplary embodiments of the present disclosure. FIG. 2 shows a schematic cross-sectional view of a display substrate taken along a line AA' in FIG. 1 according to some exemplary embodiments of the present disclosure. FIG. 3 shows a schematic cross-sectional view of a display substrate taken along a line AA' in FIG. 1 according to other exemplary embodiments of the present disclosure.

As shown in FIG. 1, the display substrate 100 may include a base substrate 1, and the base substrate 1 may be divided into two regions. For example, the base substrate 1 includes a display region AA and a peripheral region NA located on at least one side of the display region AA. For example, the peripheral region NA may be a non-display region, which may be located at at least one of an upper side, a lower side, a left side or a right side of the display region AA. FIG. 1 shows that the peripheral region NA is located on the upper side, the lower side, the left side and the right side of the display region AA. For example, the peripheral region NA may also be located only on one side of the display region AA, e.g., only on the upper side, the lower side, the left side or the right side of the display region AA. In FIG. 1, a gray filled portion is the display region AA, and the rest of the base substrate 1 is the peripheral region NA. For example, the display region AA is an image display region of the display substrate, which is a light-emitting region. For example, the peripheral region NA is a region of the display substrate in which no image is displayed, which is a non-light-emitting region.

As shown in FIG. 1, the display substrate 100 may further include a crack stopper 2 disposed on the base substrate 1 and located in the peripheral region NA, and the crack stopper is used to prevent a crack from propagating toward the display region AA.

Referring to FIG. 2, the display substrate 100 may further include an encapsulation structure 3 disposed on the base substrate 1 and covering the display region AA. The encapsulation structure 3 may include film layers alternately formed by an inorganic layer and an organic layer, for example, the encapsulation structure 3 may include a first encapsulation layer 31, a second encapsulation layer 32 and a third encapsulation layer 33 arranged in sequence. For example, the first encapsulation layer 31 and the third encapsulation layer 33 may include an inorganic material, and the second encapsulation layer 32 may include an organic material.

Referring to FIG. 1 to FIG. 3, the display substrate 100 may further include a crack detection structure 5 disposed on the base substrate 1. The crack detection structure 5 is located on a side of the crack stopper 2 facing the display region AA, and an orthographic projection of the crack detection structure 5 on the base substrate 1 falls within an orthographic projection of the encapsulation structure 3 on the base substrate 1.

In the embodiments of the present disclosure, the crack detection structure 5 is used to detect whether a crack exists in the encapsulation structure 3. That is, a reliability of the encapsulation structure 3 may be accurately determined by means of the crack detection structure 5.

In some embodiments, the crack detection structure 5 is used such that: in response to a crack existing in the encapsulation structure 3, the crack detection structure 5 is corroded, for example, by water and oxygen. For example, in some embodiments, the crack detection structure 5 is used such that: in response to a crack existing in the encapsulation structure 3, a reflectivity of the crack detection structure 5 to light incident thereon decreases. Alternatively or additionally, in some embodiments, the crack detection structure 5 is used such that: in response to a crack existing in the encapsulation structure 3, a resistivity of the crack detection structure 5 increases.

Referring to FIG. 1 to FIG. 3, the crack detection structure 5 may include a detection electrode 51 and a detection wire 52, and the detection electrode 51 and the detection wire 52 are electrically connected to each other. The detection electrode 51 and the detection wire 52 are respectively located in different conductive layers. For example, a conductive layer where the detection electrode 51 is located may be located on a side of a conductive layer where the detection wire 52 is located away from the base substrate 1. An orthographic projection of the detection electrode 51 on the base substrate 1 at least partially overlaps an orthographic projection of the detection wire 52 on the base substrate 1.

For example, as shown in FIG. 2, a side portion of the detection electrode 51 facing the crack stopper 2 is overlapped on a side portion of the detection wire 52 facing away from the crack stopper 2, so as to achieve an electrical connection between the detection electrode 51 and the detection wire 52.

For example, as shown in FIG. 3, the display substrate 100 may further include a pixel definition layer PDL, and the pixel definition layer PDL is located between the layer where the detection wire 52 is located and the layer where the detection electrode 51 is located. The detection electrode 51 is electrically connected to the detection wire 52 through a via hole VHI formed in the pixel definition layer PDL.

Referring to FIG. 1, in some embodiments, the crack detection structure 5 may include a plurality of the detection electrodes 51, and the detection wire 52 may include a plurality of detection wire segments 521.

For example, an orthographic projection of the display region AA on the base substrate 1 may have a substantially rectangular shape. The display region AA may have four side surfaces, i.e., a first side surface AA1 (a left side surface in FIG. 1), a second side surface AA2 (an upper side surface in FIG. 1), and a third side surface AA3 (a right side surface in FIG. 1) and a fourth side surface AA4 (a lower side surface in FIG. 1).

The detection electrodes 51 and the detection wire segments 521 are provided on outer sides of the first side surface AA1, the second side surface AA2 and the third side surface AA3 of the display region AA. Orthographic projections of the plurality of detection electrodes 51 on the base substrate 1 and orthographic projections of the plurality of detection wire segments 521 on the base substrate 1 are alternately disposed, and any two adjacent detection electrodes 51 among the plurality of the detection electrodes 51 are electrically connected through a detection wire segment 521. In this way, the plurality of detection wire segments 521 electrically connect the plurality of detection electrodes 51.

Continuing to refer to FIG. 1, each detection electrode 51 includes a first detection electrode segment 511 and a second detection electrode segment 512, and the first detection electrode segment 511 and the second detection electrode segment 512 included in each detection electrode 51 intersect at a connection portion 513. In the plan view shown in FIG. 1, the connection portion 513 is shown in a form of a "connection point". For example, the connection portion 513 included in each detection electrode 51 is located on a side of the detection wire segment 521 adjacent to the detection electrode 51 facing the display region AA. That is, an orthographic projection of each detection electrode 51 on the base substrate 1 has a herringbone shape. For example, the orthographic projection of each detection electrode 51 on the base substrate 1 has a herringbone shape with a vertex (i.e., the connection point) facing the display region AA. Referring to FIG. 1, the orthographic projection of each detection electrode 51 located outside the first side surface AA1 on the base substrate 1 has a herringbone shape with a vertex facing the right side; the orthographic projection of each detection electrode 51 located outside the second side surface AA2 has a herringbone shape with a vertex facing the lower side; the orthographic projection of each detection electrode 51 located outside the third side surface AA3 on the base substrate 1 has a herringbone shape with a vertex facing the left side.

An orthographic projection of each of the first detection electrode segment 511 and the second detection electrode segment 512 included in each detection electrode 51 on the base substrate 1 is disposed obliquely relative to an extension direction of an orthographic projection of the wire segment 521 adjacent to the detection electrode 51 on the base substrate 1. For example, taking a detection electrode 51 located outside the first side surface AA1 as an example, the detection electrode 51 includes the first detection electrode segment 511 and the second detection electrode segment 512, the detection wire segment 521 adjacent to the detection electrode 51 extends in a vertical direction in FIG. 1, the first detection electrode segment 511 and the second detection electrode segment 512 of the detection electrode 51 are both disposed obliquely relative to the vertical direction. In this way, a valid length of each detection electrode 51 may be increased as much as possible in a limited space, so as to ensure a stability of a resistance of each detection electrode 51. In addition, a bendability of the display substrate may also be improved.

Figure 4:
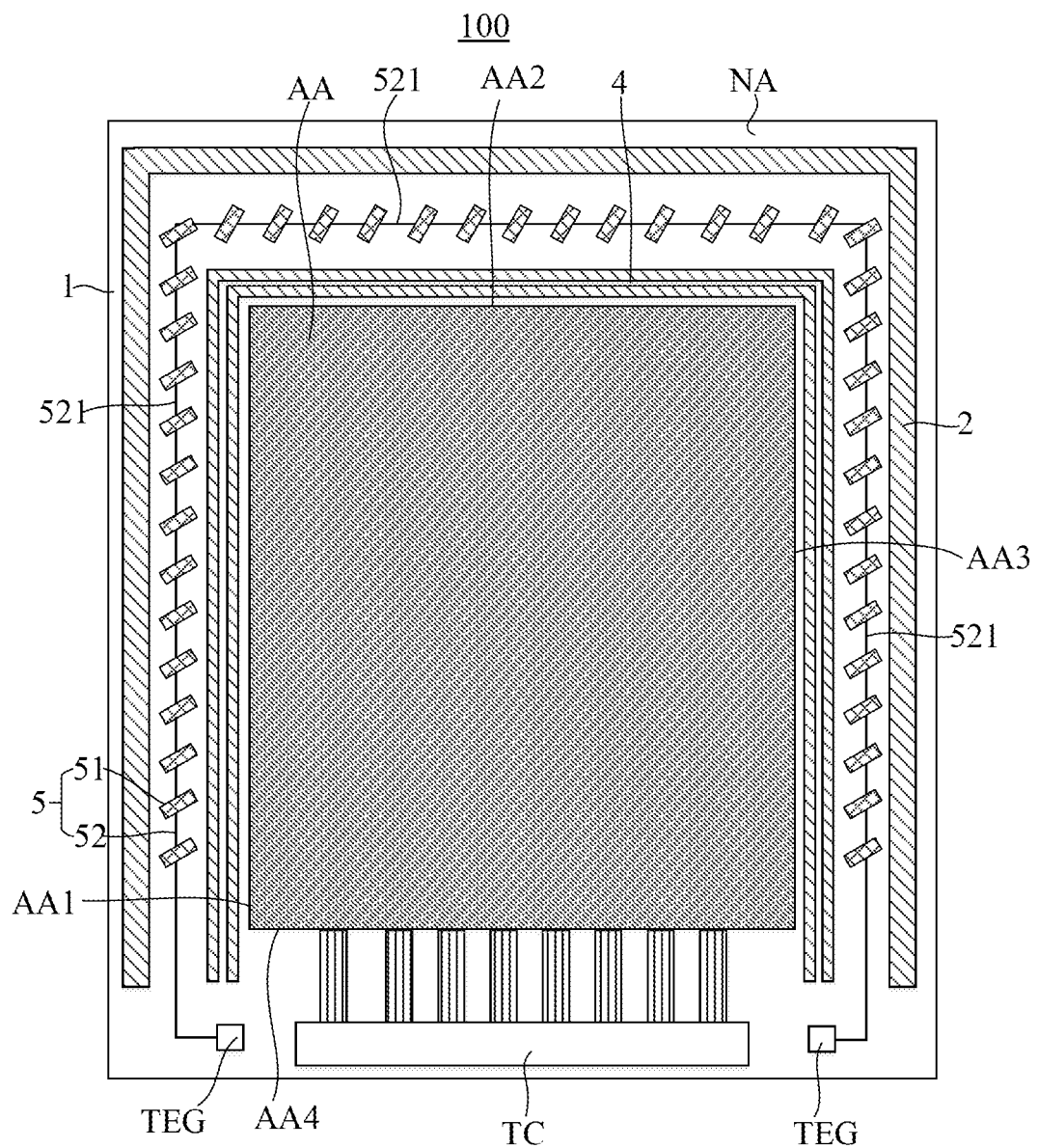
FIG. 4 shows a schematic plan view of a display substrate according to other exemplary embodiments of the present disclosure.

FIG. 4 shows a schematic plan view of a display substrate according to other exemplary embodiments of the present disclosure. As shown in FIG. 4, the crack detection structure 5 may include a plurality of the detection electrodes 51, the detection wire 52 includes a plurality of detection wire segments 521, and the plurality of detection wire segments 521 may extend continuously. For example, in the embodiment of FIG. 4, the display substrate includes three detection wire segments 521, i.e., a first detection wire segment 521 located outside the first side surface AA1, a second detection wire segment 521 located outside the second side surface AA2, and a third detection wire segment 521 located outside the third side surface AA3. The first detection wire segment may be directly connected to the second detection wire segment, and the second detection wire segment may be directly connected to the third detection wire segment, thereby forming a continuous extension structure surrounding three side surfaces of the display region AA.

Continuing to refer to FIG. 4, an orthographic projection of each detection electrode 51 on the base substrate 1 partially overlaps an orthographic projection of at least one of the plurality of detection wire segments 521 on the base substrate 1. For example, orthographic projections of each detection electrode 51 and the first detection wire segment 521 located outside the first side surface AA1 partially overlap each other, and orthographic projections of each detection electrode 51 and the second detection wire segment 521 located outside the second side surface AA2 partially overlap each other, and orthographic projections of each detection electrode 51 and the third detection wire segment 521 located outside the third side surface AA3 partially overlap each other. In addition, the detection electrode 51 located at an upper left corner may partially overlap the orthographic projection of the first detection wire segment 521, and also partially overlap the orthographic portion of the second detection wire segment 521. The detection electrode 51 located at an upper right corner may partially overlap the orthographic portion of the second detection wire segment 521, and also partially overlap the orthographic portion of the third detection wire segment 521.

In the embodiment, the orthographic projection of each detection electrode 51 on the base substrate 1 is disposed obliquely relative to an extension direction of an orthographic projection of a detection wire segment 521 overlapping the each detection electrode 51 on the base substrate 1. In this way, a valid length of each detection electrode 51 may be increased as much as possible in a limited space, so as to ensure a stability of a resistance of each detection electrode 51. In addition, a bendability of the display substrate may also be improved.

Referring to FIG. 1 and FIG. 4, the display substrate may further include a test circuit TC and a test element group TEG. The test circuit TC and the test element group TEG may be disposed outside the fourth side surface AA4. For example, the test circuit TC may be used to provide a test signal to each pixel disposed in the display region AA. The test element group TEG may be used to provide a test signal to the crack detection structure 5. For example, the test circuit TC and the test element group TEG may be formed by a same process. In this way, it is unnecessary to form the test element group TEG through an additional patterning process, which is beneficial to simplify a manufacturing process.

For example, when the test element group TEG is tested by an electrical test device, a plurality of test pins on the electrical test device are arranged in a fixed manner. The test element group TEG may include a plurality of test interfaces (i.e., test pads), and the plurality of test interfaces are arranged in a one-to-one correspondence with the plurality of test pins so as to perform a corresponding detection, that is, to receive a corresponding detection signal.

The display substrate 100 may include two test element groups TEGs, i.e., a first test element group TEG disposed near the first side surface AA1 and a second test element group TEG disposed near the third side surface AA3. The first test element group TEG is electrically connected to a detection wire segment 521 (at a lower left corner) located outside the first side surface AA1, the second test element group TEG is electrically connected to a detection wire segment 521 (at a lower right corner position) located outside the third side surface AA3, and the plurality of detection electrodes 51 located between the two detection wire segments 521 and the plurality of detection wire segments 521 alternate with each other and are electrically connected to each other. In this way, a detection signal may be provided to each detection electrode 51.

Referring to FIG. 2 and FIG. 3, the display substrate 100 may further include a blocking structure 4 disposed on the base substrate 1, and the blocking structure 4 is located on a side of the crack stopper 2 facing the display region AA. For example, the blocking structure 4 may be used to block an organic encapsulation material. When forming an organic encapsulation layer of the encapsulation structure 3, a process such as inkjet printing may be used. The blocking structure 4 may be provided to block the organic encapsulation material toward a side of the blocking structure 4 away from the display region AA.

In the embodiments of the present disclosure, the crack detection structure 5 is located between the blocking structure 4 and the crack stopper 2. That is, the orthographic projection of the crack detection structure 5 on the base substrate 1 is located between an orthographic projection of the crack stopper 2 on the base substrate 1 and an orthographic projection of the blocking structure 4 on the base substrate 1.

For example, the display substrate 100 may include a plurality of crack stopper 2 and a plurality of blocking structures 4. The crack detection structure 5 is located between the blocking structure 4 closest to the crack stopper 2 and the crack stopper 2 closest to the blocking structure 4.

Referring to FIG. 2 and FIG. 3, the display substrate 100 may include an insulating layer disposed on the base substrate 1, for example, the insulating layer may include at least an interlayer insulating layer IDL. The crack stopper 2 may include at least one trench 21, e.g., a plurality of trenches 21, formed in the insulating layer IDL. By forming the plurality of trenches 21 in the insulating layer, a crack in the insulating layer outside the stopper 2 may be prevented from propagating toward the display region AA, which is beneficial to improve an encapsulation reliability of the display substrate.

Optionally, the crack stopper 2 may further include an organic layer film layer (which will be further described below) disposed on a side of the trench 21 away from the base substrate 1.

Figure 5:
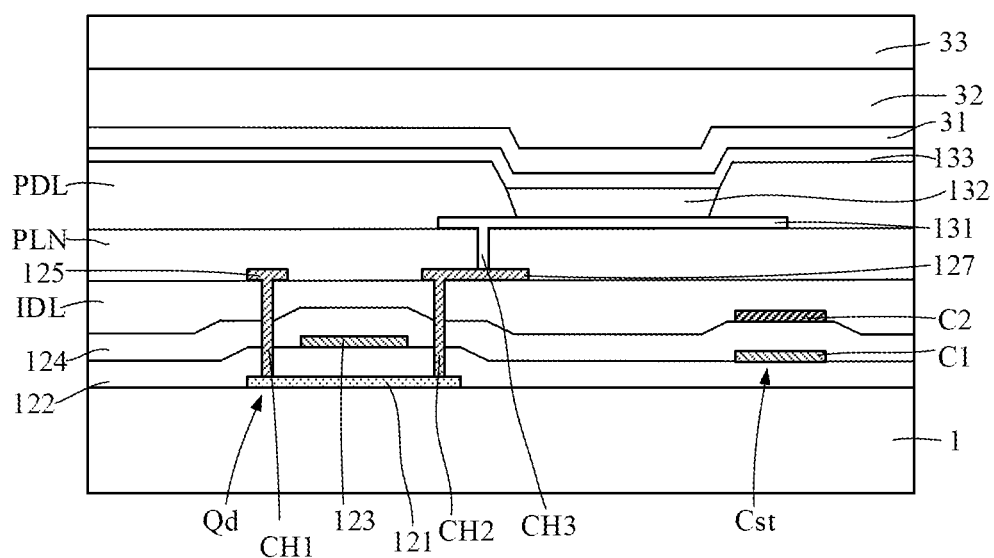
FIG. 5 shows a schematic cross-sectional view of a display substrate taken along a line BB' in FIG. 1 according to some exemplary embodiments of the present disclosure, which schematically shows a driving circuit structure layer and a light-emitting device of a pixel located in a display region.

FIG. 5 shows a schematic cross-sectional view of a display substrate taken along a line BB' in FIG. 1 according to some exemplary embodiments of the present disclosure, which schematically shows a driving circuit structure layer and a light-emitting device of a pixel located in a display region AA. Referring to FIG. 5, the display substrate 100 may include a driving circuit structure layer and a light-emitting device disposed on the base substrate 1.

In an example, FIG. 5 shows a driving transistor Qd in the driving circuit structure layer. The driving transistor Qd includes an active layer 121, a gate electrode 123, a source electrode 125, and a drain electrode 127.

The active layer 121 may be disposed on the base substrate 1. The driving circuit structure layer may further include a first insulating layer 122 disposed between the active layer 121 and the gate electrode 123. The first insulating layer 122 may insulate the active layer 121 and the gate electrode 123 from each other. The driving circuit structure layer may further include a second insulating layer 124 disposed between the gate electrode 123 and the source electrode 125 and between the gate electrode 123 and the drain electrode 127, and an interlayer insulating layer IDL disposed on a side of the gate insulating layer 124 away from the base substrate 11. The source electrode 125 and the drain electrode 127 may be electrically connected to the active layer 121 via contact holes CH1 and CH2 formed in the insulating layers, respectively.

The driving circuit structure layer may further include a planarization layer PLN disposed on the source electrode 125 and the drain electrode 127.

Although not specifically shown in FIG. 5, a switching transistor may have substantially the same structure as the driving transistor Qd or a similar structure to the driving transistor Qd, and exemplary embodiments are not limited thereto. Alternatively, the switching transistor and the driving transistor Qd may have different structures. For example, an active layer of the switching transistor and the active layer 121 of the driving transistor Qd may be disposed on different layers.

It should be understood that the driving circuit structure layer may further include a capacitor Cst. Referring to FIG. 5, the capacitor Cst includes a first electrode plate C1 and a second electrode plate C2 which are oppositely and spaced apart from each other. For example, the first electrode plate C1 may be located in the same layer as the gate electrode 123, and the second electrode plate C2 may be located on the side of the gate insulating layer 124 away from the base substrate 11. For example, both the first electrode plate C1 and the second electrode plate C2 may include the same material as the gate electrode 123.

Referring to FIG. 2, FIG. 3 and FIG. 5, in some exemplary embodiments, the driving circuit structure layer may be disposed not only in the display region AA, but also in the peripheral region NA. For example, the driving circuit structure layer may further include a plurality of wires electrically connected to the driving integrated circuit (IC), a portion of the wires may be located in the display region AA, and the other portion may be located in the peripheral region NA. For example, the wires may include an initialization voltage signal line Vint for providing an initialization voltage signal, a power supply signal line VSS for providing a VSS voltage signal, etc. The initialization voltage signal line Vint and the power supply signal line VSS may be located on the same conductive layer as the above-mentioned source electrode 125 and drain electrode 127.

The driving circuit structure layer may further include a driving circuit GOA. For example, the driving circuit may be located on at least one side of the display region AA. In the embodiment shown in FIG. 2, the driving circuit is located between the initialization voltage signal line Vint and the power supply signal line VSS. The driving circuit may be used to drive various pixels in the display substrate to display. For example, the driving circuit may include a gate driving circuit and a data driving circuit. The data driving circuit is used to sequentially latch input data according to a timing of a clock signal, and convert the latched data into an analog signal to be input to each data line of the display substrate. The gate driving circuit is usually implemented by a shift register, and the shift register converts the clock signal into on/off voltages, which are respectively output to each gate line of the display substrate.

For example, the driving circuit may use a GOA technology, i.e., Gate Driver on Array. In the GOA technology, the gate driving circuit is directly disposed on an array substrate instead of an external driving chip. Each GOA unit is used as one stage of shift register, and each stage of shift register is connected to one gate line, and a turn-on voltage is output in turn through each stage of shift register, so as to achieve a progressive scanning of pixels. In some embodiments, each stage of shift register may also be connected to a plurality of gate lines. In this way, a development trend of high resolution and narrow border of the display substrate may be adapted.

The light-emitting device may include a first electrode 131, a light-emitting layer 132, and a second electrode 133. The first electrode 131 may be disposed on a side of the planarization layer PLN away from the base substrate 1. For example, the first electrode 131 may be one of a positive electrode and a negative electrode of an OLED, such as the negative electrode; the second electrode 133 may be the other one of the positive electrode and the negative electrode of the OLED, such as the positive electrode. For example, the light-emitting layer 132 may be an organic light-emitting layer.

For example, referring to FIG. 2 and FIG. 3, the display substrate 100 may further include a conductive connection portion 128, which may be disposed in a conductive layer on a side of the power supply signal line VSS away from the base substrate 1. A portion of the conductive connection portion 128 is in contact with the power supply signal line VSS to be electrically connected to the power supply signal line VSS. Another portion of the conductive connection portion 128 may be in contact with the first electrode 131 to be electrically connected to the first electrode 131. In this way, an electrical connection between the power supply signal line VSS and the first electrode 131 may be achieved, thereby supplying the VSS voltage signal to the first electrode 131.

The pixel definition layer PDL may be located on a side of the conductive connection portion 128 away from the base substrate 1. The pixel definition layer PDL may have an opening 129. The opening 129 exposes at least a portion of the conductive connection portion 128. A portion of the first electrode 131 is filled in the opening 129 so as to be in contact with the conductive connection portion 128.

For example, an orthographic projection of the conductive connection potion 128 on the base substrate 1 partially overlaps an orthographic projection of the planarization layer PLN on the base substrate 1. In addition, a plurality of through holes 1281 are formed in the conductive connection portion 128, and the plurality of through holes 1281 respectively expose portions of the planarization layer PLN. The through holes 1281 are provided, which is beneficial to release exhaust gas such as water vapor released in a high temperature process.

The display substrate 100 may further include a spacer PS. The blocking structure 4 may include a first blocking structure 41 close to the crack detection structure 5 and a second blocking structure 42 away from the crack detection structure 5. That is, the first blocking structure 41 is closer to the crack detection structure 5 than the second blocking structure 42.

The first blocking structure 41 may include a stack, for example, the first blocking structure 41 may include a first blocking layer 411, a second blocking layer 412, and a third blocking layer 413. The first blocking layer 411 may be located in the same layer as the planarization layer PLN, the second blocking layer 412 may be located in the same layer as the pixel definition layer PDL, and the third blocking layer 413 may be located in the same layer as the spacer PS. The first blocking structure 41 at least covers a side surface of the power supply signal line VSS facing the crack detection structure 5, and covers a side surface of the conductive connection portion 128 facing the crack detection structure 5, thereby protecting the side surface of the power supply signal line VSS and the side surface of the conductive connection portion 128.

The second blocking structure 42 may include a stack, for example, the second blocking structure 42 may include a first blocking sub-layer 421 and a second blocking sub-layer 422. The first blocking sub-layer 421 may be located in the same layer as the pixel definition layer PDL, and the second blocking sub-layer 422 may be located in the same layer as the spacer PS. An orthographic projection of the second blocking structure 42 on the base substrate 1 may fall within an orthographic projection of each of the power supply signal line VSS and the conductive connection portion 128 on the base substrate 1.

As mentioned above, the encapsulation structure 3 includes the first encapsulation layer 31, the second encapsulation layer 32 and the third encapsulation layer 33 which are arranged in sequence. For example, the first encapsulation layer 31 and the third encapsulation layer 33 may include an inorganic material, and the second encapsulation layer 32 may include an organic material. An orthographic projection of the second encapsulation layer 32 on the base substrate 1 is spaced apart from an orthographic projection of the blocking structure 4 on the base substrate 1. For example, the orthographic projection of the second encapsulation layer 32 on the base substrate 1 is spaced apart from an orthographic projection of the second blocking structure 42 on the base substrate 1. That is, a side surface of the second encapsulation layer 32 facing the crack stopper 2 is located on an inner side of the blocking structure 4.

The first encapsulation layer 31 and the third encapsulation layer 33 extend to the outside of the blocking structure 4, and they both cover the crack detection structure 5. An orthographic projection of each of the first encapsulation layer 31 and the third encapsulation layer 33 on the base substrate 1 covers the orthographic projection of the crack detection structure 5 on the base substrate 1. In this way, the crack detection structure 5 may be used to detect whether a crack exists in the encapsulation structure 3.

In the embodiments of the present disclosure, a crack may easily propagate into the display region through the inorganic encapsulation layer. The crack detection structure 5 is provided in the inorganic encapsulation layers 31 and 33, which is beneficial to detect whether the crack extends into the encapsulation structure 3.

In the embodiments of the present disclosure, the detection wire 52 and the power signal wire VSS are located in the same layer, and the detection electrode 51 and the first electrode 131 are located in the same layer.

For example, the detection wire 52 includes a single-layer structure or a stack, a material of the single-layer structure includes molybdenum, and the stack includes a stack formed of Ti/Al/Ti. A material of the detection electrode 51 includes magnesium, silver or aluminium.

For example, the detection wire 52 has a thickness between 100 angstroms and 200 angstroms. The detection electrode 51 has a thickness between 100 angstroms and 500 angstroms.

Figure 6A:
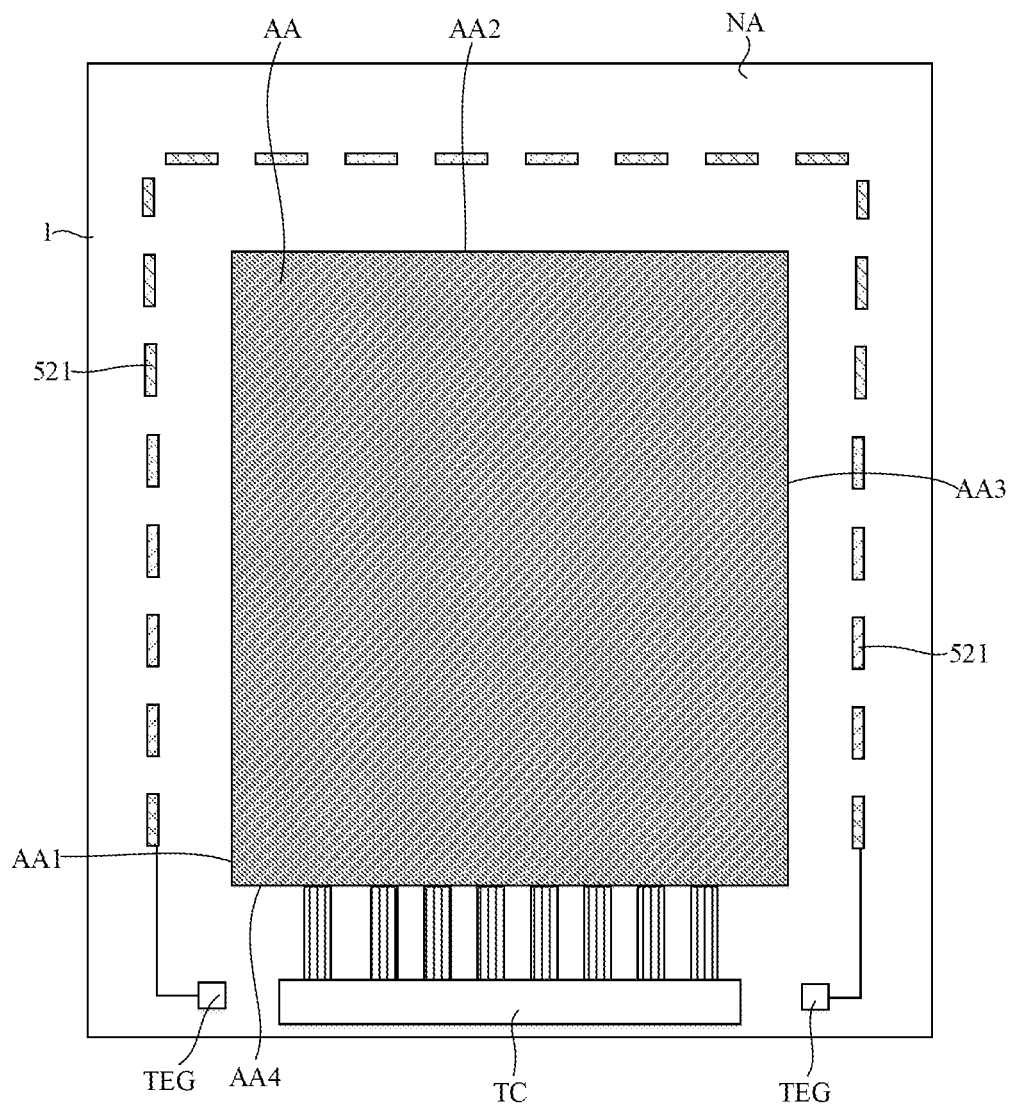
FIG. 6A schematically shows a plan view after forming a detection wire of the display substrate in FIG. 1.

In the embodiments of the present disclosure, the detection wire 52 and the power signal wire VSS are located in the same layer, so that the detection wire 52 and components, such as the power signal wire VSS, located in the same conductive layer as the detection wire 52 may be formed by the same patterning process. FIG. 6A schematically shows a plan view after forming the detection wires 52 of the display substrate in FIG. 1. Referring to FIG. 1 to FIG. 6A, the detection wire 52 and the components, such as the power supply signal line VSS, located in the same conductive layer as the detection wire 52 may be formed by the same patterning process.

Figure 6B:
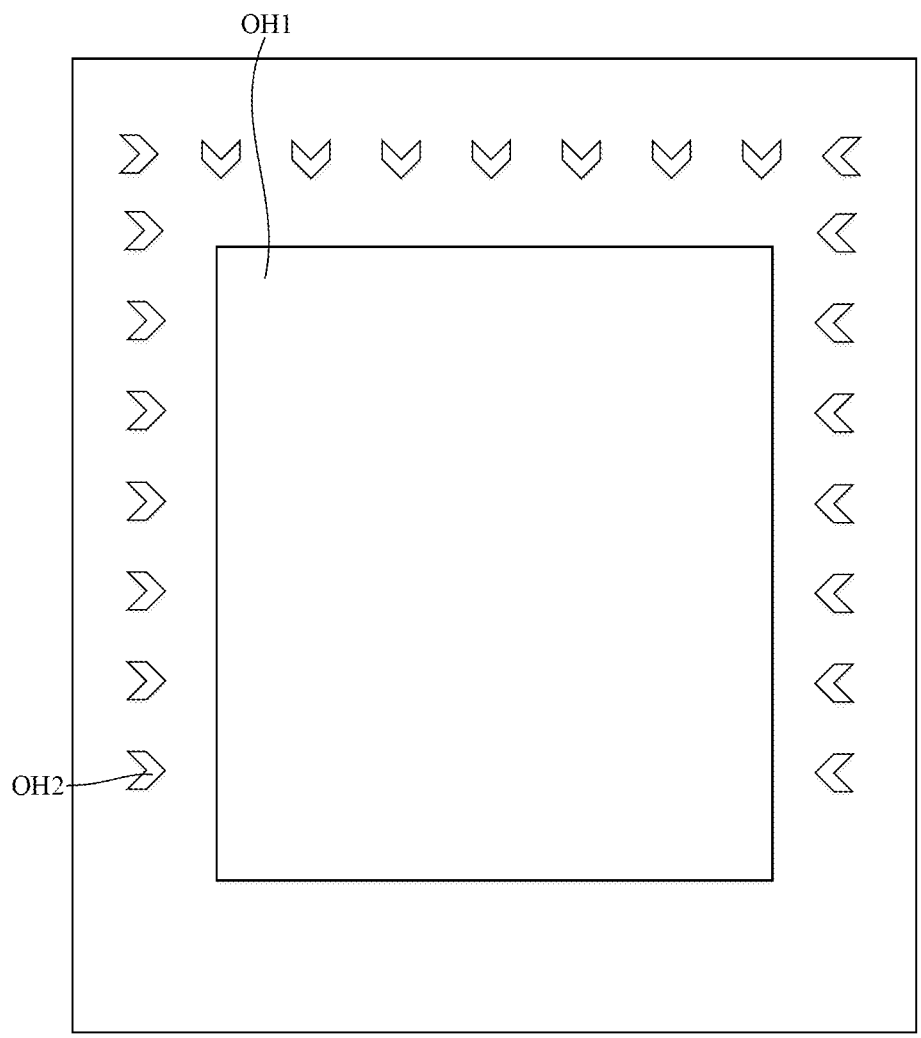
FIG. 6B schematically shows a plan view of a mask for forming a detection electrode of the display substrate in FIG. 1.

The detection electrode 51 and the first electrode 131 are located in the same layer, so that the detection electrode 51 and the first electrode 131 may be formed by the same patterning process. FIG. 6B schematically shows a plan view of a mask for forming the detection electrode 51 of the display substrate in FIG. 1. Referring to FIG. 1 to FIG. 6B, the mask may include a first opening OH1 and a plurality of second openings OH2. The first opening OH1 is an opening with a larger size for forming the first electrode 131. The plurality of second openings OH2 are used to form a plurality of detection electrodes 51. For example, in an evaporation process, the first electrode 131 and the detection electrode 51 may be formed simultaneously through the mask. In this way, it is beneficial to simplify a manufacturing process.

Figure 7A:
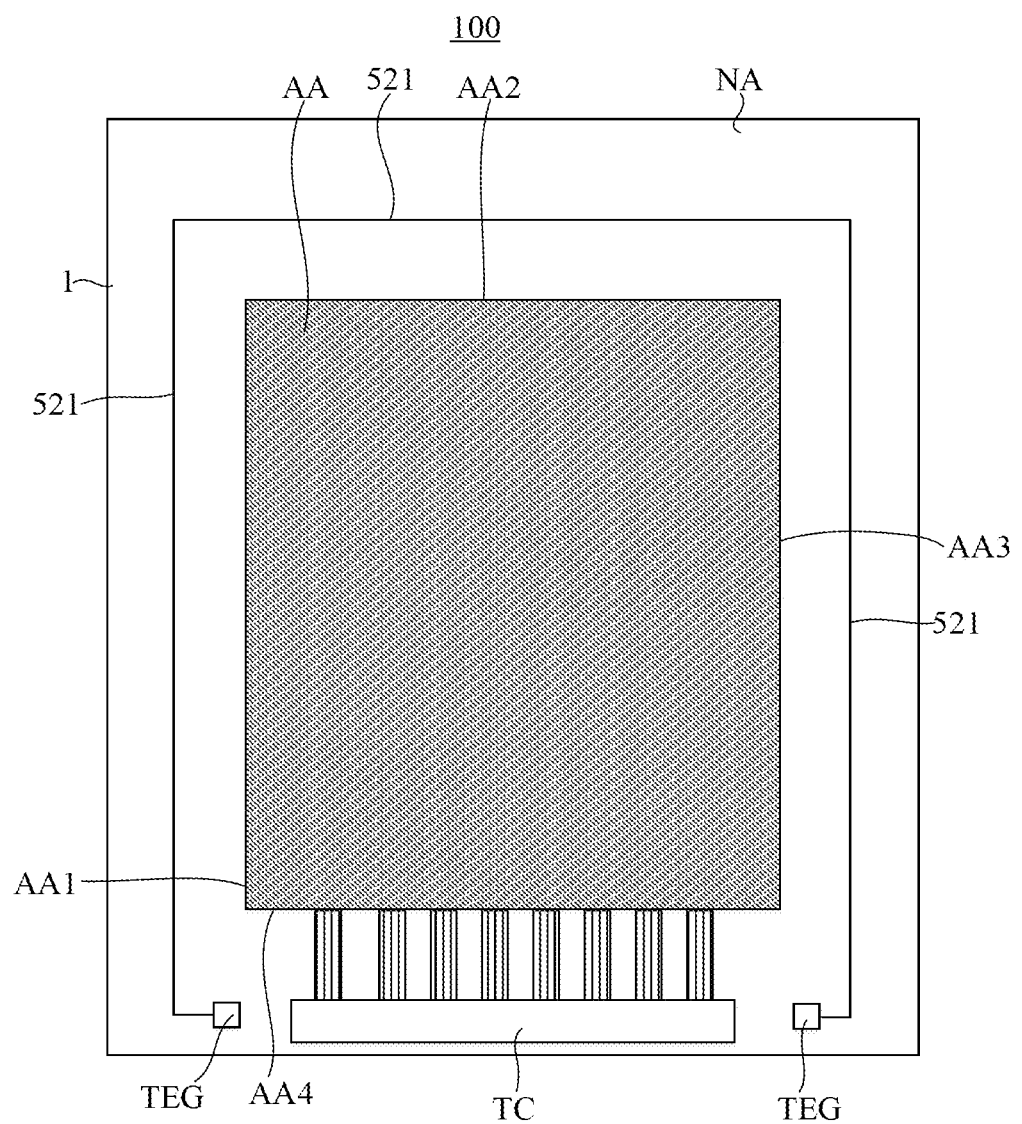
FIG. 7A schematically shows a plan view after forming a detection wire of a display substrate in FIG. 4.
Figure 7B:
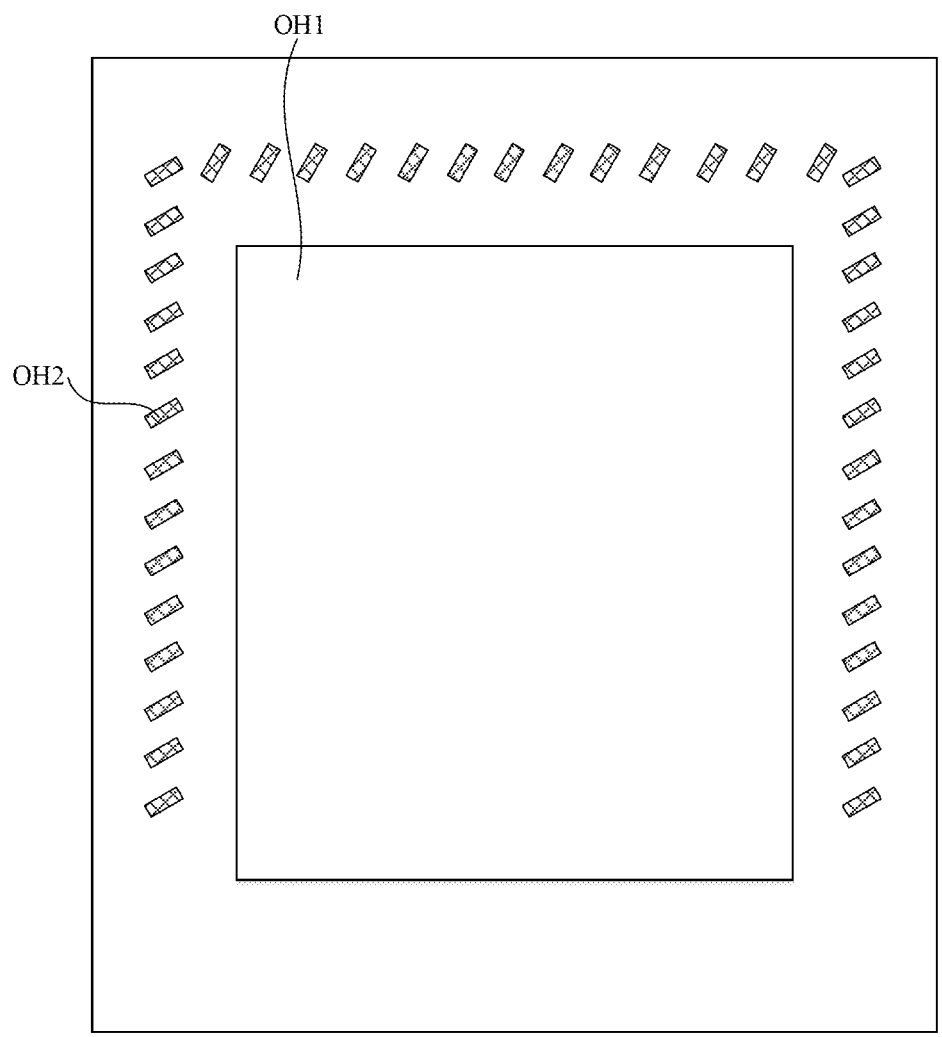
FIG. 7B schematically shows a plan view of a mask for forming a detection electrode of the display substrate in FIG. 4.

Accordingly, FIG. 7A schematically shows a plan view after forming the detection wire 52 of the display substrate in FIG. 4. FIG. 7B schematically shows a plan view of a mask for forming the detection electrode 51 of the display substrate in FIG. 4. The mask may include a first opening OH1 and a plurality of second openings OH2. The first opening OH1 is an opening with a larger size for forming the first electrode 131. The plurality of second openings OH2 are used to form a plurality of detection electrodes 51. Referring to FIG. 1 to FIG. 7B, the detection wire 52 and components, such as the power signal wire VSS, located in the same conductive layer as the detection wire 52 may be formed by the same patterning process. The detection electrode 51 and the first electrode 131 may be formed by the same patterning process. In this way, it is beneficial to simplify a manufacturing process.

Figure 8:
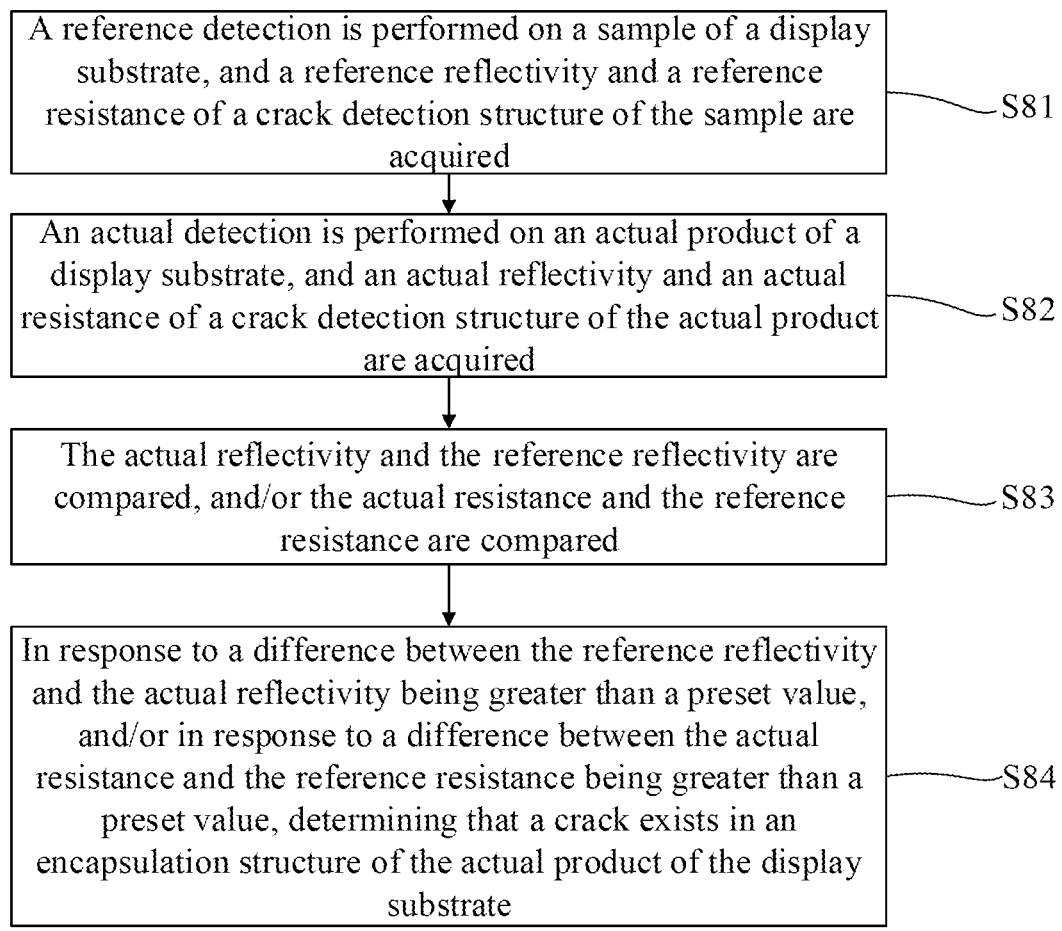
FIG. 8 shows a flowchart of a detection method for a display substrate according to some exemplary embodiments of the present disclosure.

FIG. 8 shows a flowchart of a detection method for a display substrate according to some exemplary embodiments of the present disclosure. The detection method may include steps S81 to S84.

In the step S81, a reference detection is performed on a sample of the display substrate 100, and a reference reflectivity and a reference resistance of a crack detection structure of the sample are acquired.

It should be noted that the sample of the display substrate 100 refers to a display substrate in which it is determined that there is no crack in the encapsulation structure 3. After detecting the sample, various reference values of the crack detection structure in the case that no crack exists in the encapsulation structure 3 may be acquired, for example, the reference reflectivity and the reference resistance.

In the step S82, an actual detection is performed on an actual product of a display substrate, and an actual reflectivity and an actual resistance of a crack detection structure of the actual product are acquired.

It should be noted that the actual product of the display substrate 100 refers to an actual product manufactured on a production line. After the actual product are manufactured, under an influence of an actual processing process, for example, during cutting, a crack may be generated at an edge of the display substrate, and the crack may propagate into the encapsulation structure 3.

In the step S83, the actual reflectivity and the reference reflectivity are compared, and/or the actual resistance and the reference resistance are compared.

In the step S84, when a difference between the reference reflectivity and the actual reflectivity is greater than a preset value, and/or when a difference between the actual resistance and the reference resistance is greater than a preset value, it is determined that a crack exists in an encapsulation structure of the actual product of the display substrate.

Optionally, in the above-mentioned step S81, a reference image of the crack detection structure of the sample may also be acquired. For example, the crack detection structure of the sample may be photographed to acquire the reference image.

In the step S82, an actual image of the crack detection structure of the actual product is also acquired. For example, the crack detection structure of the actual product may be photographed to acquire the actual image.

In the step S83, a difference between the reference image and the actual image is also compared. In the step S84, when the difference between the reference image and the actual image is large, it is determined whether the crack detection structure is corroded, and in response to the crack detection structure being corroded, determining that a crack exists in the encapsulation structure of the actual product of the display substrate.

For example, in some exemplary embodiments, by comparing the reference image and the actual image, it may be found that there are many traces of corrosion in the actual image of the crack detection structure. That is, the crack detection structure of the display substrate has been corroded. In this case, it may be determined that a crack exists in the encapsulation structure 3 of the display substrate.

Figure 9A:
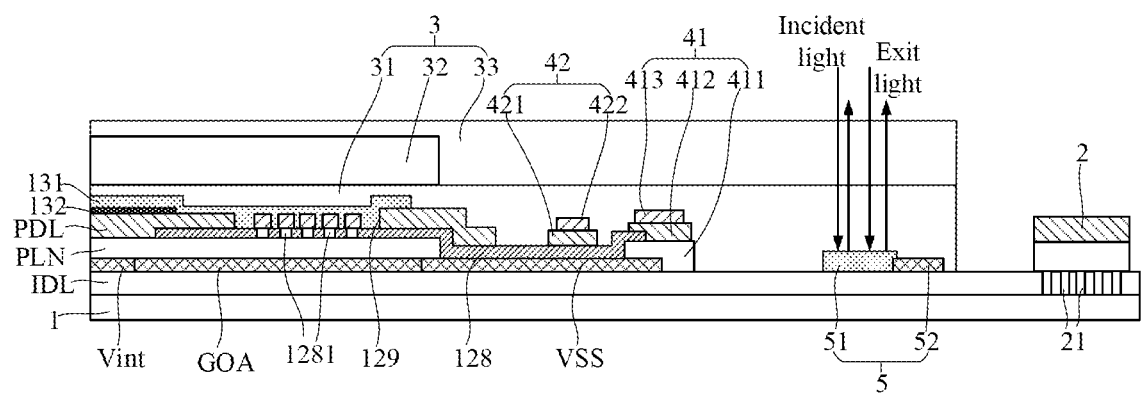
FIG. 9A and FIG. 9B show schematic diagrams of automatic optical inspections (i.e., AOIs) without a crack and with a crack in an encapsulation structure, respectively.
Figure 9B:
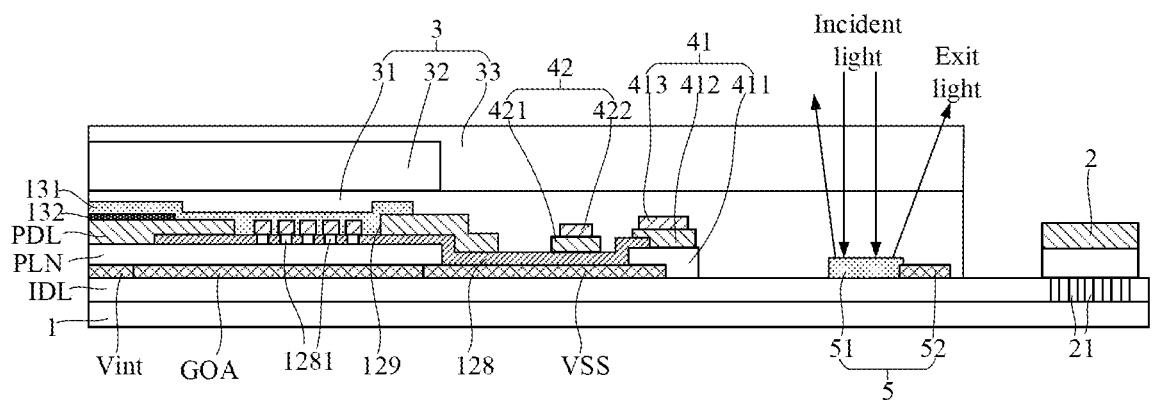

FIG. 9A and FIG. 9B show schematic diagrams of automatic optical inspections (i.e., AOIs) without a crack and with a crack in an encapsulation structure, respectively. As shown in FIG. 9A, no crack exists in the encapsulation structure 3, and the crack detection structure 5 is not corroded by water, oxygen, etc. During an AOI detection process, incident light is substantially reflected back by the crack detection structure 5, that is, a reflectivity is high. As shown in FIG. 9B, a crack exists in the encapsulation structure 3, and the crack detection structure 5 is corroded by water, oxygen, etc. During the AOI detection process, the incident light irradiates the crack detection structure 5 to produce an effect similar to a diffuse reflection, and reflected light received by an AOI detection device is reduced, that is, the reflectivity is low. That is, the reflectivity of the crack detection structure 5 in the case that no crack exists in the encapsulation structure is greater than that in the case that a crack exists in the encapsulation structure. By determining whether the difference between the reference reflectivity and the actual reflectivity is greater than a preset value, whether a crack exists in the encapsulation structure 3 may be determined.

It should be noted that the "preset value" here may be an absolute value, for example, more than 10%; the "preset value" may also be a relative value, for example, the "preset value" here may be represented by a ratio of the difference to the reference reflectivity. For example, if the ratio of the difference to the reference reflectivity is greater than 5%, it is determined that the difference between the reference reflectivity and the actual reflectivity is greater than the preset value.

Similarly, referring to FIG. 1 and FIG. 4, electrical properties of the crack detection structure 5 may be detected by means of the test element group TEG, for example, a resistivity of the crack detection structure 5 is detected. In the case that no crack exists in the encapsulation structure 3, the crack detection structure 5 is not corroded, and thus the crack detection structure 5 has a good electrical conductivity and a small resistivity. In the case that a crack exists in the encapsulation structure 3, the crack detection structure 5 is corroded by water, oxygen, etc., and thus the crack detection structure 5 has a poor electrical conductivity and a large resistivity. That is, the resistivity of the crack detection structure 5 in the case that a crack exists in the encapsulation structure is greater than that in the case that no crack exists in the encapsulation structure. By determining whether the difference between the actual resistivity and the reference resistivity is greater than a preset value, whether a crack exists in the encapsulation structure 3 may be determined.

It should be noted that the "preset value" here may be an absolute value, for example, more than $0.1*10^{-8}$ (Ω·m); the "preset value" may also be a relative value, for example, the "preset value" here may be represented by a ratio of the difference to the reference resistivity, for example, if the ratio of the difference to the reference resistivity is greater than 5%, it is determined that the difference between the actual resistivity and the reference resistivity is greater than the preset value.

In other embodiments of the present disclosure, a display device is further provided. The display device may include the above-mentioned display substrate. For example, the display device may be a smart phone, a mobile phone, a video phone, an e-book reader, a desktop computer (PC), a laptop PC, a netbook PC, a personal digital assistant (PDA), a portable multimedia player (PMP), a digital audio player, a mobile medical device, a camera, a wearable device (such as a headset, an electronic clothing, an electronic wristband or smart watch), etc.

Although some embodiments according to the general inventive concept of the present disclosure have been illustrated and described, those skilled in the art will appreciate that changes may be made to these embodiments without departing from the principle and spirit of the general inventive concept of the present disclosure, and the scope of the present disclosure is defined by the claims and their equivalents.

What is claimed is:

1. A display substrate, comprising:
a base substrate comprising a display region and a peripheral region located on at least one side of the display region;
a crack stopper located in the peripheral region and configured to prevent a crack from propagating toward the display region;
an encapsulation structure disposed on the base substrate and covering the display region; and
a crack detection structure disposed on the base substrate, wherein
the crack detection structure is located on a side of the crack stopper facing the display region, an orthographic projection of the crack detection structure on the base substrate falls within an orthographic projection of the encapsulation structure on the base substrate, and the crack detection structure is configured to detect whether a crack exists in the encapsulation structure,
the crack detection structure comprises a detection electrode and a detection wire, and the detection electrode and the detection wire are electrically connected to each other,
the detection electrode and the detection wire are respectively located in different conductive layers,
an orthographic projection of the detection electrode on the base substrate at least partially overlaps an orthographic projection of the detection wire on the base substrate, and
a side portion of the detection electrode facing the crack stopper is overlapped on a side portion of the detection wire facing away from the crack stopper, so as to achieve an electrical connection between the detection electrode and the detection wire.

2. The display substrate according to claim 1, wherein the crack detection structure is configured such that: in response to a crack existing in the encapsulation structure, a reflectivity of the crack detection structure to light incident thereon decreases; and/or, in response to a crack existing in the encapsulation structure, a resistivity of the crack detection structure increases.

3. The display substrate according to claim 2, wherein the crack detection structure comprises a detection electrode and a detection wire, and the detection electrode and the detection wire are electrically connected to each other, and
- the detection electrode and the detection wire are respectively located in different conductive layers, and
- an orthographic projection of the detection electrode on the base substrate at least partially overlaps an orthographic projection of the detection wire on the base substrate.

4. The display substrate according to claim 2, wherein the encapsulation structure comprises: a first encapsulation layer disposed on a side of a second electrode away from the base substrate, a second encapsulation layer disposed on a side of the first encapsulation layer away from the base substrate, and a third encapsulation layer disposed on a side of the second encapsulation layer away from the base substrate, and wherein the first encapsulation layer and the third encapsulation layer comprise an inorganic material, and the second encapsulation layer comprises an organic material, and
- an orthographic projection of the second encapsulation layer on the base substrate is spaced apart from the orthographic projection of the crack detection structure on the base substrate, and an orthographic projection of each of the first encapsulation layer and the third encapsulation layer on the base substrate covers the orthographic projection of the crack detection structure on the base substrate.

5. The display substrate according to claim 1, wherein the display substrate further comprises a pixel definition layer, and the pixel definition layer is located between a layer where the detection wire is located and a layer where the detection electrode is located, and
- the detection electrode is electrically connected to the detection wire through a via hole formed in the pixel definition layer.

6. The display substrate according to claim 1, wherein the crack detection structure comprises a plurality of the detection electrodes, the detection wire comprises a plurality of detection wire segments, and orthographic projections of the plurality of detection electrodes on the base substrate and orthographic projections of the plurality of detection wire segments on the base substrate are alternately disposed, and any two adjacent detection electrodes among the plurality of detection electrodes are electrically connected through a detection wire segment,
- each of the plurality of the detection electrodes includes a first detection electrode segment and a second detection electrode segment, and the first detection electrode segment and the second detection electrode segment included in the each detection electrode intersect at a connection portion, and
- an orthographic projection of each of the first detection electrode segment and the second detection electrode segment included in the each detection electrode on the base substrate is disposed obliquely relative to an extension direction of an orthographic projection of a detection wire segment adjacent to the each detection electrode on the base substrate.

7. The display substrate according to claim 6, wherein the connection portion included in each detection electrode is located on a side of a detection wire segment adjacent to the each detection electrode facing the display region.

8. The display substrate according to claim 1, wherein the crack detection structure comprises a plurality of the detection electrodes, the detection wire comprises a plurality of detection wire segments, and the plurality of detection wire segments extend continuously,
- an orthographic projection of each of the plurality of the detection electrodes on the base substrate partially overlaps an orthographic projection of at least one of the plurality of detection wire segments on the base substrate, and
- the orthographic projection of each detection electrode on the base substrate is disposed obliquely relative to an extension direction of an orthographic projection of a detection wire segment overlapping the each detection electrode on the base substrate.

9. The display substrate according to claim 1, wherein the display substrate further comprises a blocking structure disposed on the base substrate, and the blocking structure is located on a side of the crack stopper facing the display region, and
- the orthographic projection of the crack detection structure on the base substrate is located between an orthographic projection of the crack stopper on the base substrate and an orthographic projection of the blocking structure on the base substrate.

10. The display substrate according to claim 1, wherein
- the display substrate further comprises a light-emitting device disposed on the base substrate and a driving circuit for driving the light-emitting device,
- the light-emitting device comprises a first electrode disposed on the base substrate, a light-emitting layer disposed on a side of the first electrode away from the base substrate, and a second electrode disposed on a side of the light-emitting layer away from the base substrate,
- the driving circuit at least comprises a power supply signal line for supplying a first power supply voltage, and the power supply signal line is electrically connected to the first electrode, and
- the detection wire and the power supply signal line are located in a same layer, and the detection electrode and the first electrode are located in a same layer.

11. The display substrate according to claim 10, wherein the detection wire comprises a single-layer structure or a stack, a material of the single-layer structure comprises molybdenum, and the stack comprises a stack formed of Ti/Al/Ti; and/or
- a material of the detection electrode comprises magnesium, silver or aluminum.

12. The display substrate according to claim 11, wherein the detection wire has a thickness between 100 angstroms and 200 angstroms; and/or
- the detection electrode has a thickness between 100 angstroms and 500 angstroms.

13. The display substrate according to claim 10, wherein the detection wire has a thickness between 100 angstroms and 200 angstroms; and/or
- the detection electrode has a thickness between 100 angstroms and 500 angstroms.

14. The display substrate according to claim 1, wherein the encapsulation structure comprises: a first encapsulation layer disposed on a side of a second electrode away from the base substrate, a second encapsulation layer disposed on a side of the first encapsulation layer away from the base substrate, and a third encapsulation layer disposed on a side of the second encapsulation layer away from the base substrate, and wherein the first encapsulation layer and the third encapsulation layer comprise an inorganic material, and the second encapsulation layer comprises an organic material, and an orthographic projection of the second encapsulation layer on the base substrate is spaced apart from the orthographic projection of the crack detection structure on the base substrate, and an orthographic projection of each of the first encapsulation layer and the third encapsulation layer on the base substrate covers the orthographic projection of the crack detection structure on the base substrate.

15. A display device comprising a display substrate, wherein the display substrate comprises:

a base substrate comprising a display region and a peripheral region located on at least one side of the display region;

a crack stopper located in the peripheral region and configured to prevent a crack from propagating toward the display region;

an encapsulation structure disposed on the base substrate and covering the display region; and a crack detection structure disposed on the base substrate, wherein the crack detection structure is located on a side of the crack stopper facing the display region, an orthographic projection of the crack detection structure on the base substrate falls within an orthographic projection of the encapsulation structure on the base substrate, and the crack detection structure is configured to detect whether a crack exists in the encapsulation structure, the crack detection structure comprises a detection electrode and a detection wire, and the detection electrode and the detection wire are electrically connected to each other, the detection electrode and the detection wire are respectively located in different conductive layers, an orthographic projection of the detection electrode on the base substrate at least partially overlaps an orthographic projection of the detection wire on the base substrate, and a side portion of the detection electrode facing the crack stopper is overlapped on a side portion of the detection wire facing away from the crack stopper, so as to achieve an electrical connection between the detection electrode and the detection wire.

16. The display device according to claim 15, wherein the crack detection structure is configured such that: in response to a crack existing in the encapsulation structure, a reflectivity of the crack detection structure to light incident thereon decreases; and/or, in response to a crack existing in the encapsulation structure, a resistivity of the crack detection structure increases.

17. A detection method for a display substrate, wherein the display substrate comprises: a base substrate comprising a display region and a peripheral region located on at least one side of the display region; a crack stopper located in the peripheral region and configured to prevent a crack from propagating toward the display region; an encapsulation structure disposed on the base substrate and covering the display region; and a crack detection structure disposed on the base substrate; and wherein the detection method comprises:

performing a reference detection on a sample of a display substrate, and acquiring a reference reflectivity and a reference resistance of a crack detection structure of the sample;

performing an actual detection on an actual product of a display substrate, and acquiring an actual reflectivity and an actual resistance of a crack detection structure of the actual product;

comparing the actual reflectivity to the reference reflectivity, and/or comparing the actual resistance to the reference resistance; and in response to a difference between the reference reflectivity and the actual reflectivity being greater than a preset value, and/or in response to a difference between the actual resistance and the reference resistance being greater than a preset value, determining that a crack exists in an encapsulation structure of the actual product of the display substrate.

* * * * *